(12) United States Patent
Lehtola

(10) Patent No.: US 11,916,517 B2
(45) Date of Patent: Feb. 27, 2024

(54) SATURATION DETECTION OF POWER AMPLIFIERS

(71) Applicant: Skyworks Solutions, Inc., Irvine, CA (US)

(72) Inventor: Philip John Lehtola, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 779 days.

(21) Appl. No.: 16/947,916

(22) Filed: Aug. 24, 2020

(65) Prior Publication Data

US 2021/0036661 A1 Feb. 4, 2021

Related U.S. Application Data

(63) Continuation of application No. 16/854,081, filed on Apr. 21, 2020, now abandoned.

(60) Provisional application No. 62/837,364, filed on Apr. 23, 2019.

(51) Int. Cl.
*H03F 1/02* (2006.01)
*H03F 3/24* (2006.01)
*H04B 1/04* (2006.01)
*H04B 1/16* (2006.01)

(52) U.S. Cl.
CPC ......... *H03F 1/0216* (2013.01); *H03F 1/0288* (2013.01); *H03F 3/245* (2013.01); *H03F 2200/171* (2013.01); *H03F 2200/451* (2013.01); *H04B 1/04* (2013.01); *H04B 1/16* (2013.01)

(58) Field of Classification Search
CPC ...... H03F 1/0216; H03F 1/0288; H03F 3/245; H03F 2200/171; H03F 2200/451; H03F 3/19; H04B 1/04; H04B 1/16; H04B 2001/0408
See application file for complete search history.

(56) References Cited

U.S. PATENT DOCUMENTS

| | | | |
|---|---|---|---|
| 4,743,862 A | 5/1988 | Scheinberg | |
| 6,445,601 B1 | 9/2002 | Worley | |
| 6,476,677 B1 | 11/2002 | Komaili et al. | |
| 6,734,729 B1 | 5/2004 | Andrys et al. | |
| 6,873,211 B1 | 3/2005 | Thompson et al. | |
| 6,950,636 B2 | 9/2005 | Rozenblit et al. | |
| 7,292,104 B1 | 11/2007 | Liwinski | |
| 7,427,895 B1 * | 9/2008 | Okubo | H03F 1/0288 330/136 |
| 7,605,651 B2 | 10/2009 | Ripley et al. | |
| 7,706,760 B2 | 4/2010 | Rozenblit et al. | |
| 7,920,836 B2 | 4/2011 | Rozenblit et al. | |
| 8,022,770 B1 | 9/2011 | Wang | |

(Continued)

*Primary Examiner* — Akm Zakaria
(74) *Attorney, Agent, or Firm* — Knobbe, Martens, Olson & Bear, LLP

(57) ABSTRACT

Apparatus and methods for saturation detection of power amplifiers are provided. In certain embodiments, a power amplifier system including a power amplifier and a saturation detector is provided. The power amplifier includes a gain transistor that amplifies an RF input signal to generate an RF output signal, and the saturation detector includes a detection transistor that is thermally coupled to the gain transistor. Additionally, the saturation detector monitors an input voltage to the gain transistor to generate a saturation detection signal indicating a saturation of the gain transistor.

20 Claims, 15 Drawing Sheets

(56) References Cited

U.S. PATENT DOCUMENTS

| | | |
|---|---|---|
| 8,103,226 B2 | 1/2012 | Andrys et al. |
| 8,188,793 B2 | 5/2012 | Ripley et al. |
| 8,248,163 B2 | 8/2012 | Wang |
| 8,330,546 B2 | 12/2012 | Ripley et al. |
| 8,362,840 B2 | 1/2013 | Andrys et al. |
| 8,432,228 B1 | 4/2013 | Dolin |
| 8,587,380 B2 | 11/2013 | Wang |
| 8,611,836 B2 | 12/2013 | Ripley et al. |
| 8,666,337 B2 | 3/2014 | Ripley et al. |
| 8,749,273 B2 | 6/2014 | Andrys et al. |
| 8,928,356 B2 | 1/2015 | Andrys et al. |
| 9,035,701 B2 | 5/2015 | Schooley et al. |
| 9,041,472 B2 | 5/2015 | Chen et al. |
| 9,214,712 B2 | 12/2015 | Cruickshank et al. |
| 9,419,567 B2 | 8/2016 | Ripley et al. |
| 9,515,611 B2 | 12/2016 | Andrys et al. |
| 9,520,835 B2 | 12/2016 | Ko et al. |
| 9,602,056 B2 | 3/2017 | Lehtola |
| 9,621,118 B2 | 4/2017 | Ripley et al. |
| 9,621,119 B2 | 4/2017 | Lehtola |
| 9,654,155 B2 | 5/2017 | Lehtola |
| 9,698,734 B2 | 7/2017 | Lehtola et al. |
| 9,698,736 B2 | 7/2017 | Ripley et al. |
| 9,712,125 B2 | 7/2017 | Lehtola et al. |
| 9,722,547 B2 | 8/2017 | Ripley et al. |
| 9,780,741 B2 | 10/2017 | Ripley et al. |
| 9,787,260 B2 | 10/2017 | Lehtola |
| 9,793,037 B2 | 10/2017 | Cruickshank et al. |
| 9,806,681 B2 | 10/2017 | Lehtola |
| 9,838,058 B2 | 12/2017 | Pehlke et al. |
| 9,893,684 B2 | 2/2018 | Lehtola |
| 9,893,687 B2 | 2/2018 | Lehtola |
| 9,899,961 B2 | 2/2018 | Lehtola et al. |
| 9,923,523 B2 | 3/2018 | Lehtola |
| 9,935,594 B2 | 4/2018 | Lehtola |
| 9,979,349 B2 | 5/2018 | Lehtola |
| 9,991,850 B2 | 6/2018 | Lehtola |
| 10,644,374 B1* | 5/2020 | Lee .................. H03K 17/6872 |
| 2007/0008038 A1* | 1/2007 | Klepser ............ H03F 3/45183 |
| | | 375/345 |
| 2007/0264947 A1 | 11/2007 | Rozenblit et al. |
| 2012/0286866 A1* | 11/2012 | Khanifar ................ H03F 3/245 |
| | | 330/149 |
| 2015/0155843 A1* | 6/2015 | Scott ....................... H03F 1/523 |
| | | 330/285 |
| 2015/0326181 A1 | 11/2015 | Chen et al. |
| 2015/0326183 A1 | 11/2015 | Chen et al. |
| 2015/0349741 A1 | 12/2015 | Lehtola et al. |
| 2016/0093948 A1 | 3/2016 | Lehtola |
| 2016/0241205 A1 | 8/2016 | Lehtola |
| 2016/0241206 A1 | 8/2016 | Lehtola |
| 2016/0241207 A1 | 8/2016 | Lehtola |
| 2016/0242057 A1 | 8/2016 | Ripley et al. |
| 2017/0019076 A1 | 1/2017 | Ripley et al. |
| 2017/0141734 A1 | 5/2017 | Lehtola |
| 2017/0155383 A1 | 6/2017 | Andrys et al. |
| 2017/0250727 A1 | 8/2017 | Lehtola |
| 2017/0302230 A1 | 10/2017 | Lehtola et al. |
| 2017/0302231 A1 | 10/2017 | Ripley et al. |
| 2017/0317653 A1 | 11/2017 | Lehtola et al. |
| 2017/0366168 A1* | 12/2017 | Roberg .................. H03F 3/195 |
| 2018/0097483 A1 | 4/2018 | Lehtola |
| 2018/0130585 A1 | 5/2018 | Cruickshank et al. |
| 2018/0159577 A1 | 6/2018 | Pehlke et al. |
| 2018/0183389 A1 | 6/2018 | Lehtola et al. |
| 2018/0241360 A1 | 8/2018 | Lehtola |
| 2019/0097582 A1 | 3/2019 | Lehtola |
| 2019/0097585 A1 | 3/2019 | Lehtola |
| 2019/0140591 A1 | 5/2019 | Lehtola |
| 2019/0149099 A1 | 5/2019 | Lehtola |
| 2019/0158045 A1 | 5/2019 | Zampardi, Jr. et al. |
| 2019/0158046 A1 | 5/2019 | Lehtola et al. |
| 2019/0165738 A1 | 5/2019 | Pan et al. |
| 2019/0165739 A1 | 5/2019 | Lyalin et al. |
| 2019/0214945 A1 | 7/2019 | Lehtola |
| 2019/0229688 A1 | 7/2019 | Lehtola |
| 2019/0260367 A1 | 8/2019 | Andrys et al. |
| 2019/0305728 A1 | 10/2019 | Lehtola |
| 2019/0326864 A1 | 10/2019 | Lehtola |
| 2020/0014338 A1 | 1/2020 | Datta et al. |
| 2020/0028472 A1* | 1/2020 | Scott .......................... H03F 3/20 |
| 2020/0044609 A1 | 2/2020 | Lehtola |
| 2020/0091870 A1 | 3/2020 | Lehtola et al. |
| 2020/0099346 A1 | 3/2020 | Lehtola et al. |
| 2020/0106405 A1 | 4/2020 | Lehtola |
| 2020/0162032 A1 | 5/2020 | Ripley et al. |
| 2020/0162039 A1 | 5/2020 | Lehtola et al. |
| 2020/0336113 A1 | 10/2020 | Pan et al. |

\* cited by examiner

SATURATION DETECTION OF POWER AMPLIFIERS

CROSS-REFERENCE TO RELATED APPLICATIONS

This application is a continuation of U.S. patent application Ser. No. 16/854,081, filed Apr. 21, 2020 and titled "SATURATION DETECTION OF POWER AMPLIFIERS," which claims the benefit of priority under 35 U.S.C. § 119 of U.S. Provisional Patent Application No. 62/837,364, filed Apr. 23, 2019 and titled "SATURATION DETECTION OF POWER AMPLIFIERS," which is herein incorporated by reference in its entirety.

BACKGROUND

Field

Embodiments of the invention relate to electronic systems, and in particular, to radio frequency (RF) electronics.

Description of the Related Technology

Power amplifiers are used in RF communication systems to amplify RF signals for transmission via antennas.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 425 MHz to about 7.125 GHz for Frequency Range 1 (FR1) of the Fifth Generation (5G) communication standard.

SUMMARY

In certain embodiments, the present disclosure relates to a power amplifier system. The power amplifier system includes a power amplifier including an input configured to receive a radio frequency signal and a gain transistor configured to amplify the radio frequency signal. The power amplifier system further includes a saturation detector including a detection transistor that is thermally coupled to the gain transistor. The saturation detector including an input electrically connected to the input of the power amplifier and an output configured to generate a saturation detection signal indicating a saturation of the gain transistor.

In various embodiments, the power amplifier is a Doherty power amplifier including a carrier amplification stage and a peaking amplification stage. According to a number of embodiments, the carrier amplification stage includes the gain transistor, and the saturation detector is configured to provide the saturation detection signal to the peaking amplification stage. In accordance with some embodiments, the saturation detection signal is operable to turn on the peaking amplification stage in response to the saturation detection signal indicating that the gain transistor is saturated. According to several embodiments, the saturation detection signal is operable to adjust a bias of the peaking amplification stage.

In a number of embodiments, the saturation detection signal is operable to adjust a voltage level of a power amplifier supply voltage of the power amplifier. According to various embodiments, the power amplifier system further includes a power management circuit configured to increase the voltage level of the power amplifier supply voltage in response to the saturation detection signal indicating that the gain transistor has saturated.

In several embodiments, the saturation detection signal is operable to adjust a load line impedance of the power amplifier.

In some embodiments, the saturation detection signal is operable to adjust an input power of the radio frequency signal.

In various embodiments, the detection transistor and the gain transistor are located within about 20 µm.

In several embodiments, the detection transistor and the gain transistor are fabricated on a surface of a semiconductor substrate, and separated by a distance of less than half of a thickness of the semiconductor substrate.

In a number of embodiments the power amplifier system further includes an array of transistor elements, the gain transistor implemented by a first portion of elements of the array and the detection transistor implemented by a second portion of elements of the array.

In some embodiments, the detection transistor is smaller than the gain transistor.

In various embodiments, the gain transistor and the detection transistor are NPN bipolar transistors.

In several embodiments, the saturation detector further includes a modulation bandwidth filter electrically connected between the input of the saturation detector and an input to the detection transistor.

In a number of embodiments, the power amplifier is implemented as a common emitter amplifier.

In certain embodiments, the present disclosure relates to a mobile device. The mobile device includes a transceiver configured to generate a radio frequency signal, and a front end system including a power amplifier configured to receive the radio frequency signal at an input and including a gain transistor configured to amplify the radio frequency signal. The front end system further including a saturation detector including a detection transistor that is thermally coupled to the gain transistor, the saturation detector including an input electrically connected to the input of the power amplifier and an output configured to generate a saturation detection signal indicating a saturation of the gain transistor.

In various embodiments, the power amplifier is a Doherty power amplifier including a carrier amplification stage and a peaking amplification stage. According to several embodiments, the carrier amplification stage includes the gain transistor, and the saturation detector is configured to provide the saturation detection signal to the peaking amplification stage. In accordance with a number of embodiments, the saturation detection signal is operable to turn on the peaking amplification stage in response to the saturation detection signal indicating that the gain transistor is saturated. According to various embodiments, the saturation detection signal is operable to adjust a bias of the peaking amplification stage.

In some embodiments, the saturation detection signal is operable to adjust a voltage level of a power amplifier supply voltage of the power amplifier. According to various embodiments, the mobile device further includes a power management system configured to increase the voltage level of the power amplifier supply voltage in response to the saturation detection signal indicating that the gain transistor has saturated.

In several embodiments, the saturation detection signal is operable to adjust a load line impedance of the power amplifier.

In a number of embodiments, the saturation detection signal is operable to adjust an input power of the radio frequency signal.

In various embodiments, the detection transistor and the gain transistor are located within about 20 μm.

In some embodiments the detection transistor and the gain transistor are fabricated on a surface of a semiconductor substrate, and separated by a distance of less than half of a thickness of the semiconductor substrate.

In several embodiments, the front end system includes an array of transistor elements, the gain transistor implemented by a first portion of elements of the array and the detection transistor implemented by a second portion of elements of the array.

In a number of embodiments, the detection transistor is smaller than the gain transistor.

In various embodiments, the gain transistor and the detection transistor are NPN bipolar transistors.

In several embodiments, the saturation detector further includes a modulation bandwidth filter electrically connected between the input of the saturation detector and an input to the detection transistor.

In some embodiments, the power amplifier is implemented as a common emitter amplifier.

In various embodiments, the mobile device further includes an antenna configured to wirelessly transmit an amplified radio frequency signal from the power amplifier.

In certain embodiments, the present disclosure relates to a method of power amplifier saturation detection. The method includes receiving a radio frequency signal at an input to a power amplifier, amplifying the radio frequency signal using a gain transistor of the power amplifier, and generating a saturation detection signal indicating a saturation of the gain transistor using a saturation detector, including thermally coupling the gain transistor to a detection transistor of the saturation detector, and providing an input voltage at the input of the power amplifier to an input of the saturation detector.

In various embodiments, amplifying the radio frequency signal includes providing the radio frequency signal to a carrier amplification stage and a peaking amplification stage of the power amplifier. According to a number of embodiments, the carrier amplification stage includes the gain transistor, and the method further includes providing the saturation detection signal to the peaking amplification stage. In accordance with several embodiments, the method further includes turning on the peaking amplification stage in response to the saturation detection signal indicating that the gain transistor is saturated. According to some embodiments, the method further includes adjusting a bias of the peaking amplification stage using the saturation detection signal.

In several embodiments, the method further includes adjusting a voltage level of a power amplifier supply voltage of the power amplifier using the saturation detection signal. According to a number of embodiments, adjusting the voltage level of the power amplifier supply voltage includes increasing the voltage level of the power amplifier supply voltage in response to the saturation detection signal indicating that the gain transistor has saturated using a power management circuit.

In various embodiments, the method further includes adjusting a load line impedance of the power amplifier using the saturation detection signal.

In some embodiments, the method further includes adjusting an input power of the radio frequency signal using the saturation detection signal.

In several embodiments, the detection transistor and the gain transistor are located within about 20 μm.

In some embodiments, the detection transistor and the gain transistor are fabricated on a surface of a semiconductor substrate, and separated by a distance of less than half of a thickness of the semiconductor substrate.

In various embodiments, the gain transistor is implemented by a first portion of elements of an array of transistor elements and the detection transistor is implemented by a second portion of elements of the array of transistor elements.

In several embodiments, the detection transistor is smaller than the gain transistor.

In some embodiments, the gain transistor and the detection transistor are NPN bipolar transistors.

In a number of embodiments, the method further includes controlling a modulation bandwidth of the saturation detector using a modulation bandwidth filter.

In various embodiments, the power amplifier is implemented as a common emitter amplifier.

In a number of embodiments, the method further includes transmitting an amplified radio frequency signal from the power amplifier using an antenna.

In certain embodiments, the present disclosure relates to a packaged module. The packaged module includes a package substrate and a semiconductor die attached to the package substrate. The semiconductor die includes a power amplifier and a saturation detector having an input electrically connected to an input of the power amplifier. The power amplifier includes a gain transistor configured to amplify a radio frequency signal. The saturation detector includes a detection transistor that is thermally coupled to the gain transistor and operable to generate a saturation detection signal indicating a saturation of the gain transistor.

In various embodiments, the power amplifier is a Doherty power amplifier including a carrier amplification stage and a peaking amplification stage. According to a number of embodiments, the carrier amplification stage includes the gain transistor, and the saturation detector is configured to provide the saturation detection signal to the peaking amplification stage. In accordance with several embodiments, the saturation detection signal is operable to turn on the peaking amplification stage in response to the saturation detection signal indicating that the gain transistor is saturated. According to some embodiments, the saturation detection signal is operable to adjust a bias of the peaking amplification stage.

In various embodiments, the saturation detection signal is operable to adjust a voltage level of a power amplifier supply voltage of the power amplifier.

In a number of embodiments, the saturation detection signal is operable to adjust a load line impedance of the power amplifier.

In several embodiments, the saturation detection signal is operable to adjust an input power of the radio frequency signal.

In various embodiments, the detection transistor and the gain transistor are located within about 20 μm.

In a number of embodiments, the detection transistor and the gain transistor are fabricated on a surface of the semiconductor die, and separated by a distance of less than half of a thickness of the semiconductor die.

In various embodiments, the semiconductor die includes an array of transistor elements, and the gain transistor is implemented by a first portion of elements of the array and the detection transistor is implemented by a second portion of elements of the array.

In several embodiments, the detection transistor is smaller than the gain transistor.

In a number of embodiments, the gain transistor and the detection transistor are NPN bipolar transistors.

In various embodiments, the saturation detector further includes a modulation bandwidth filter electrically connected between the input of the saturation detector and an input to the detection transistor.

In several embodiments, the power amplifier is implemented as a common emitter amplifier.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
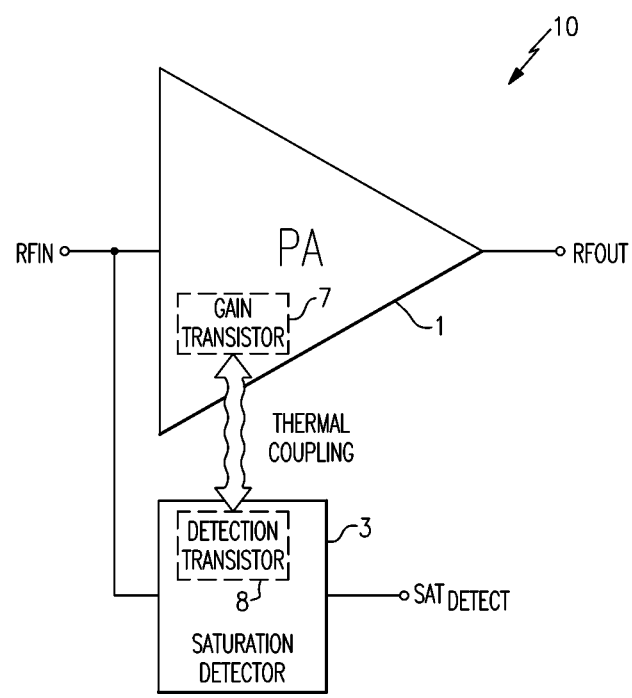
FIG. 1 is a schematic diagram of one embodiment of a power amplifier system with saturation detection.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The linearity of a power amplifier is directly related to a level of gain compression within the power amplifier. Thus, a power amplifier can be designed for a fixed supply voltage that defines the target load impedance for acceptable linearity.

In certain applications, such as mobile handsets, operating environment leads to a relatively large variation in the load presented to a power amplifier. For example, a voltage standing wave ratio (VSWR) of an antenna and thus the power amplifier's load can vary based on a user's handling of the mobile handset. The load variation degrades power amplifier linearity and/or spectral performance.

One type of power amplifier is a Doherty power amplifier, which includes a main or carrier amplification stage and an auxiliary or peaking amplification stage that operate in combination with one another to amplify an RF signal. The Doherty power amplifier combines a carrier signal from the carrier amplification stage and a peaking signal from the peaking stage to generate an amplified RF output signal. In certain implementations, the carrier amplification stage is enabled over a wide range of power levels while the peaking amplification stage is selectively enabled (for instance, by a class C bias circuit) at high power levels.

Such Doherty power amplifiers operate with high efficiency at 6 dB power back-off, but suffer from inefficiencies at lower power levels, for very high peak-to-average ratio (PAPR) waveforms, and/or when the output power is not well-centered at the peak of the amplifier's power-dependent efficiency profile.

Moreover, the linearity of a Doherty power amplifier is particularly susceptible to degradation in the presence of load variation. For example, an amplitude distortion (AM/AM) of the carrier amplification stage is a function of the load VSWR, while the AM/AM of the peaking amplification stage is a function of input power, which is typically uncorrelated to the load VSWR.

Conventional saturation detection schemes suffer from a number of drawbacks.

For instance, certain saturation detection schemes include a large design overhead for the power amplifier load such that anticipated load variation presented to the power amplifier does not result in unacceptable levels of compression and linearity degradation. However, such design overhead results in degradation of transmit efficiency and/or increased current drain.

In another example, an isolator is used or loss introduced into the output network of the power amplifier to thereby decrease load variation presented to the power amplifier. However, such an approach also degrades transmit efficiency, increases power consumption, and/or raises cost by increasing component count.

Apparatus and methods for saturation detection of power amplifiers are provided herein. In certain embodiments, a power amplifier system including a power amplifier and a saturation detector is provided. The power amplifier includes a gain transistor that amplifies an RF input signal to generate an RF output signal, and the saturation detector includes a detection transistor that is thermally coupled to the gain transistor. Additionally, the saturation detector monitors an input voltage to the gain transistor to generate a saturation detection signal indicating a saturation of the gain transistor.

In certain implementations, the saturation detector serves to monitor a compression of the power amplifier, and the saturation detection signal is used to provide an adjustment to reduce or eliminate a performance degradation arising from the compression. For example, the saturation detection signal can be processed using feedback to dynamically adjust a power amplifier's supply voltage, load line, input power, and/or other suitable operating characteristic.

Thus, the teachings herein are not only applicable to saturation detectors for detecting a gain compression of a power amplifier, but also to compensation schemes for reducing or eliminating performance degradation arising from saturation.

In certain implementations, the power amplifier is a Doherty power amplifier. For example, the saturation detector can be used to monitor for saturation of the carrier amplification stage, and to provide an adjustment to the peaking amplification stage for compensation when the carrier amplification stage is in saturation.

In contrast, a Doherty power amplifier without such compensation has poor performance in the presence of changes of VSWR. For instance, the AM/AM of the carrier amplification stage is a function of the load VSWR, while the AM/AM of the peaking amplification stage is a function of input power, which is typically uncorrelated to the load VSWR. Thus, severe non-linearity can occur even with low VSWR when the compression characteristic of the carrier amplification stage is in sync with the turn-on characteristic of the peaking amplification stage.

In certain implementations, the gain transistor and the detection transistor are bipolar transistors. For example, the power amplifier can be implemented as a common-emitter amplifier, and the saturation detector can serve to detect saturation by monitoring the input voltage (for instance, a DC input voltage and/or baseband input voltage) at the base of the bipolar gain transistor.

According, when the power amplifier is not in saturation, the base voltage of the bipolar gain transistor is about equal to $V_{BE}$. However, when saturation occurs or starts to occur, the bipolar gain transistor's collector-emitter voltage is about equal to the transistor's knee voltage, leading to the transistor turning OFF over a portion of the RF signal cycle and degradation of the transistors DC beta parameter (corresponding to the ratio of the collector current to the base current, or $\beta=I_C/I_B$). As $\beta$ degrades during saturation, $I_B$ rapidly decrease, leading to additional current times resistance (I*R) voltage drop across a DC ballast resistor and a decrease in base voltage below $V_{BE}$.

The teachings herein are applicable to a wide variety of RF communication systems, including, but not limited to, base stations, network access points, mobile phones, tablets, customer-premises equipment (CPE), laptops, computers, wearable electronics, and/or other communication devices.

FIG. 1 is a schematic diagram of one embodiment of a power amplifier system 10 with saturation detection. The power amplifier system 10 includes a power amplifier 1 and a saturation detector 3.

As shown in FIG. 1, the power amplifier 10 amplifies an RF input signal received at an input terminal RFIN, and provides an RF output signal at an output terminal RFOUT. The power amplifier 10 includes a gain transistor 7 operable to amplify the RF input signal.

The gain transistor 7 can be implemented in a wide variety of ways. In one example, the power amplifier 1 is implemented as a common-emitter amplifier, and the gain transistor 7 corresponds to a bipolar transistor, such as an NPN bipolar transistor. However, other implementations are possible.

As shown in FIG. 1, the power amplifier system 10 further includes the saturation detector 3, which includes an input electrically connected to an input of the power amplifier 1. Additionally, the saturation detector 3 includes a detection transistor 8 that is thermally coupled to the gain transistor 7. The saturation detector 3 outputs a saturation detection signal $SAT_{DETECT}$ indicating whether or not the power amplifier 1 is in saturation.

To provide thermal coupling, the power amplifier 1 and the saturation detector 3 can be fabricated on a common substrate of a semiconductor die. Additionally, the gain transistor 7 and the detection transistor 8 can be placed in relatively close proximity.

In a first example, a transistor layout of the gain transistor 7 and a transistor layout of the detection transistor 8 are placed within about 20 μm of one another to provide robust thermal coupling.

In a second example, a transistor layout of the gain transistor 7 and a transistor layout of the detection transistor 8 are fabricated on a surface of a die's semiconductor substrate. Additionally, a distance between the transistor layouts is less than about 50% of the thickness of the substrate, or more particularly, less than about 20% of the thickness of the substrate. For instance, heat emanating from the gain transistor 7 can radiate conically into the die's substrate with an angle of about 45° in certain fabrication technologies. Thus, locating the transistor layouts of the gain transistor 7 and the detection transistor 8 within about half the thickness of the die's substrate provides thermal coupling.

In a third example, an array of transistor elements is provided, with a first portion of the transistor elements used to implement the gain transistor 7 and a second portion of the transistor elements used to implement the detection transistor 8.

Although various example implementations for providing thermal coupling have been provided above, thermal coupling can be provided in other ways. For example, an implementation of transistor layouts sufficient to achieve thermal coupling can depend on a variety of factors, such as processing technology, circuit design, and/or amplifier operating parameters. Accordingly, other implementations are possible.

In certain implementations, the gain transistor 7 and the detection transistor 8 can be of a common transistor type and polarity, for instance, NPN bipolar transistors. Additionally, the input of the gain transistor 7 and the input of the detection transistor 8 are both electrically connected to the input terminal RFIN. For instance, in an implementation using NPN bipolar transistors, both a base of the gain transistor and a base of the detection transistor 8 can be electrically connected to the input terminal RFIN.

By implementing, the power amplifier system 10 in this manner and with thermal coupling between the transistors, the conduction of the detection transistor 8 can track the saturation of the gain transistor 7. For example, the detection transistor 8 can control the signal level of the saturation detection signal $SAT_{DETECT}$ to indicate whether or not the power amplifier 1 is in saturation.

In certain implementations, the saturation detector 3 includes a modulation bandwidth filter, such as a resistor-capacitor (RC) filter, for setting a modulation bandwidth used for detection. For example, the modulation bandwidth filter can be included between an input of the saturation detector 3 and an input to the detection transistor 8. Including the modulation bandwidth filter aids in providing detection over a modulation bandwidth suitable for a particular RF input signal.

Figure 2A:
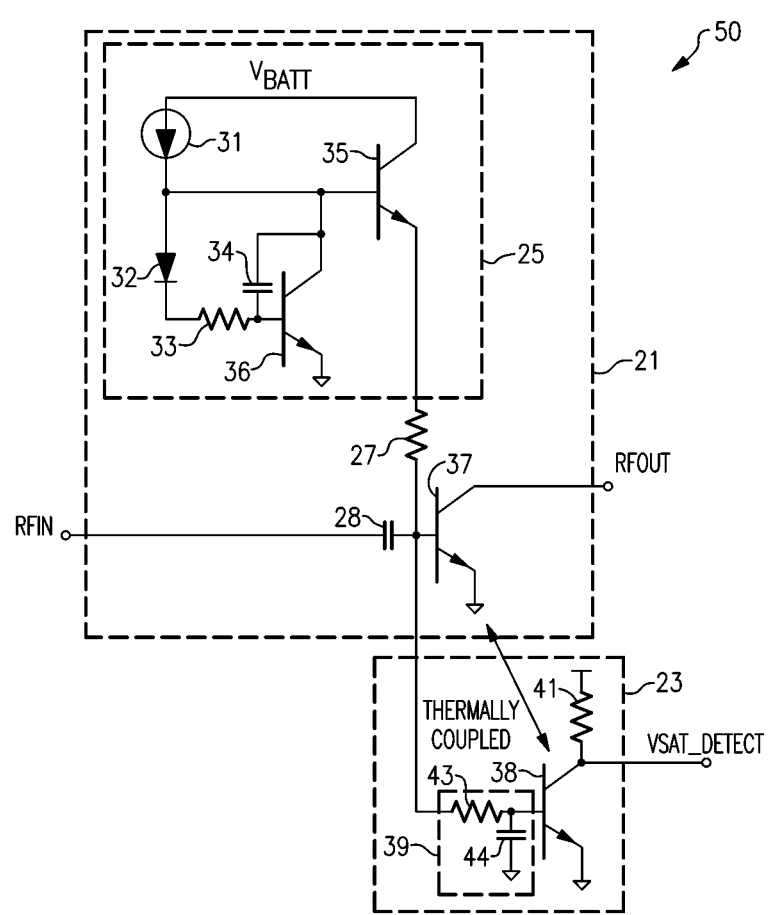
FIG. 2A is a schematic diagram of another embodiment of a power amplifier system with saturation detection.

FIG. 2A is a schematic diagram of another embodiment of a power amplifier system 50 with saturation detection. The power amplifier system 50 includes a power amplifier 21 and a saturation detector 23.

As shown in FIG. 2A, the power amplifier 21 amplifies an RF input signal received at an input terminal RFIN, and provides an RF output signal at an output terminal RFOUT. The power amplifier 21 includes a bias circuit 25, a first bias resistor 27, a DC blocking capacitor 28, and a bipolar gain transistor 37 operable to amplify the RF input signal. In the illustrated embodiment, the bias circuit 25 is powered by a battery voltage $V_{BATT}$, and includes a reference current source 31, a diode 32, a second bias resistor 33, a bias capacitor 34, a first bipolar bias transistor 35, and a second bipolar bias transistor 36.

Although one embodiment of a power amplifier is depicted in FIG. 2A, the teachings herein are applicable to power amplifiers implemented in a wide variety of ways.

With continuing reference to FIG. 2A, the saturation detector 23 includes a bipolar detection transistor 38, a modulation bandwidth filter 39, and a detection resistor 41. Additionally, the modulation filter 39 includes a filter resistor 43 and a filter capacitor 44. The bipolar detection transistor 38 is thermally coupled to the bipolar gain transistor 37, and includes a base electrically connected to a base of the bipolar gain transistor 37 through the modulation bandwidth filter 39, an emitter electrically connected to ground, and a collector electrically connected to a power supply voltage through the detection resistor 41. The collector of the bipolar detection transistor 38 provides a detection voltage VSAT_DETECT.

Although one embodiment of a saturation detector is depicted in FIG. 2A, the teachings herein are applicable to saturation detectors implemented in a wide variety of ways.

In this example, the gain transistor and the detection transistor are implemented as thermally coupled NPN bipolar transistors. Additionally, the detection transistor serves to detect small changes in the base voltage and to provide process and temperature compensation.

The power amplifier system 50 can be implemented with a wide range of component values. In one example, the bipolar gain transistor 37 has an emitter area AE, the bipolar detection transistor 38 is a factor k (for instance, ten or more) smaller than the bipolar gain transistor 37, the diode 32 has an area 5 $\mu m^2$, the first bipolar bias transistor 35 has an emitter area M*5 $\mu m^2$, the second bipolar bias transistor 36 has an emitter area AE/M, the first bias resistor 27 has a resistance $R_B$, and the second bias resistor 33 has a resistance $M*R_B$. Although one specific example of component values has been provided, the power amplifier system 50 can be implemented with a wide range of component values.

In the illustrated embodiment, the saturation detector 23 includes the modulation bandwidth filter 39, which is implemented as an RC filter, in this example. The modulation bandwidth filter 39 aids in setting a modulation bandwidth used for detection, thereby providing detection over a modulation bandwidth suitable for a particular RF input signal.

Although illustrated as including fixed components, in certain implementations a modulation bandwidth filter includes one or more controllable components. For example, in certain implementations, at least one of a resistance of the filter resistor 43 or a capacitance of the filter capacitor 44 is controllable or adjustable, for instance, digitally programmed based on data receiver over a chip interface or bus.

Including one or more controllable components in a modulation bandwidth filter provides a number of advantages, such as an ability to compensate for process, voltage, and/or temperature (PVT) variation and/or to provide dynamic adjustment to the modulation bandwidth based on characteristics of the RF input signal, such as frequency band and/or signal bandwidth.

Figure 2B:
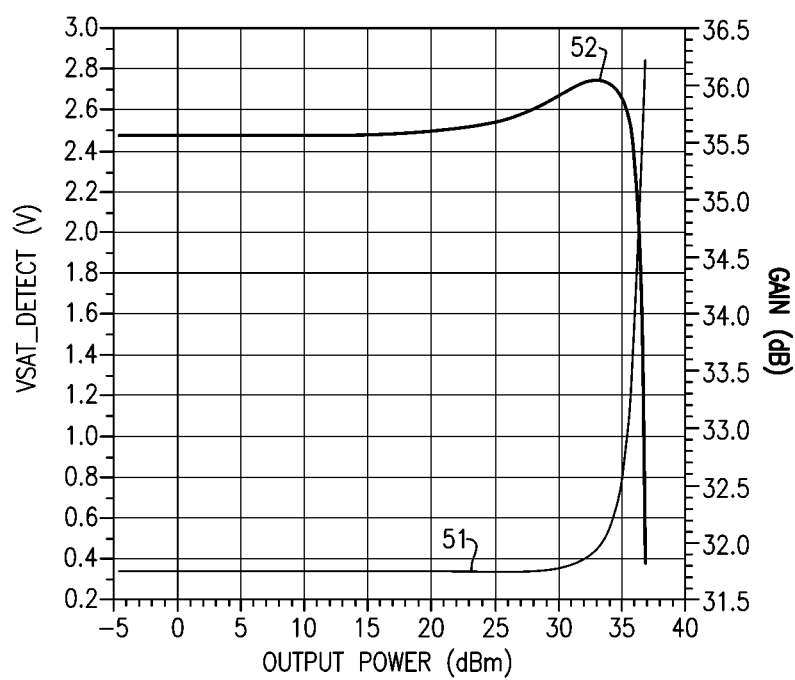
FIG. 2B is a graph of one example of saturation detection signal level and power amplifier gain versus output power.

FIG. 2B is a graph of one example of saturation detection signal level and power amplifier gain versus output power. The graph includes a first plot 51 of the detection voltage VSAT_DETECT versus output power, and a second plot 52 of gain of the power amplifier 21 versus output power.

Although one example of simulation results are depicted, simulation results can vary based on a wide variety of factors, such as design implementation and/or simulation tools, models, and/or parameters. Accordingly, other results are possible.

In the illustrated example, the saturation detector is implemented to detect for very small changes in base voltage, for instance, tens of mV. Additionally, the detection voltage VSAT_DETECT is implemented to have a low voltage when the power amplifier 21 is not saturated, and to have a high voltage when the power amplifier 21 is saturated.

Figure 3:
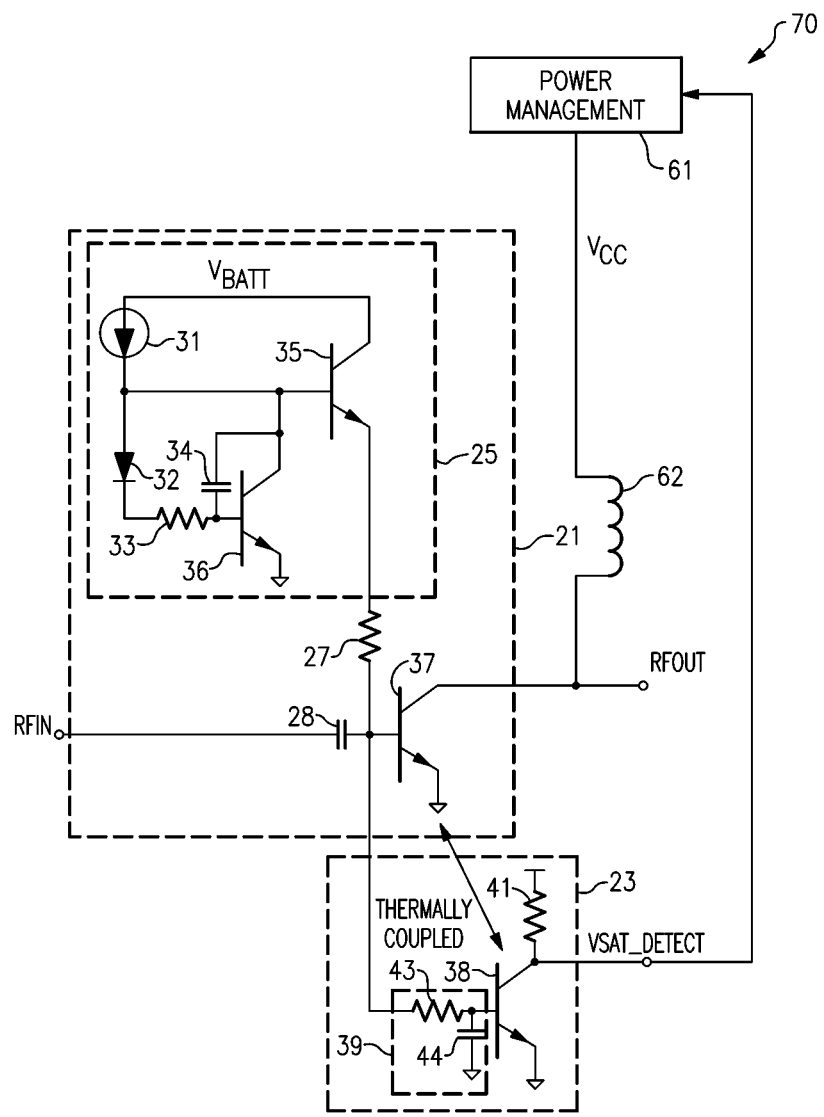
FIG. 3 is a schematic diagram of another embodiment of a power amplifier system with saturation detection.

FIG. 3 is a schematic diagram of another embodiment of a power amplifier system 70 with saturation detection. The power amplifier 70 includes a power amplifier 21, a saturation detector 23, a power management circuit 61, and an inductor 62.

The power amplification system 70 of FIG. 3 is similar to the power management system 50 of FIG. 2A, except that the power amplifier system 70 further includes the power management circuit 61 and the inductor 62.

As shown in FIG. 3, the power management circuit 61 outputs a power amplifier supply voltage $V_{CC}$, which is provided to the power amplifier 21 through the inductor 62. The power amplifier supply voltage $V_{CC}$ serves to supply power to the power amplifier 21. For example, the power amplifier supply voltage $V_{CC}$ controls a DC collector voltage of the bipolar gain transistor 37, in this example. The power management circuit 61 can be implemented in a wide variety of ways, such as using a power management integrated circuit (PMIC). In certain implementations, the power management circuit 61 includes a DC-to-DC converter, such as a buck-boost switching regulator, used to generate the power amplifier supply voltage $V_{CC}$ based on the battery voltage $V_{BATT}$ of a battery.

In the illustrated embodiment, the voltage level of the power amplifier supply voltage $V_{CC}$ is controlled based on the saturation voltage VSAT_DETECT. For example, in response to the saturation voltage VSAT_DETECT indicating that the power amplifier 25 has saturated, the power management circuit 61 can increase the voltage level of the power amplifier supply voltage $V_{CC}$.

Although the illustrated embodiment includes a power management circuit that receives a saturation detection signal, the teachings herein are applicable to power amplifier systems that process a saturation detection signal in a wide variety of ways. In another example, a control circuit decreases a load line impedance of a power amplifier in response to a saturation detection signal indicating that the power amplifier has saturated. In yet another example, a control circuit decreases an input power of a power amplifier in response to a saturation detection signal indicating that the power amplifier has saturated.

Accordingly, power amplifier systems can process a saturation detection signal in a wide variety of ways.

Figure 4:
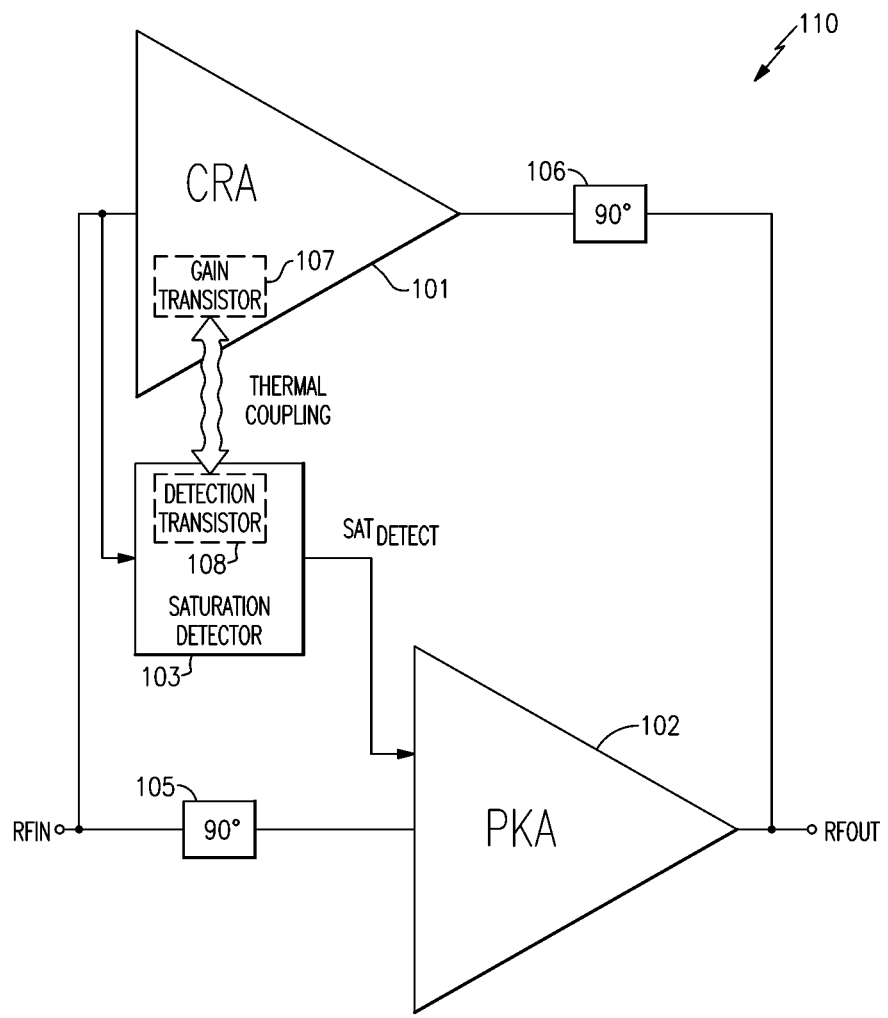
FIG. 4 is a schematic diagram of another embodiment of a power amplifier system with saturation detection.

FIG. 4 is a schematic diagram of another embodiment of a power amplifier system 110 with saturation detection. The power amplifier system 110 includes a Doherty power amplifier including a carrier amplification stage 101, a peaking amplification stage 102, an input phase shifter 105, and an output phase shifter 106. The power amplifier system 110 further includes a saturation detector 103.

The power amplifier system 110 of FIG. 4 illustrates one example of a Doherty power amplifier implemented with saturation detection in accordance with the teachings herein. Although one embodiment of a Doherty power amplifier implemented with saturation detection is shown, the teachings herein are applicable to power amplifiers implemented in a wide variety of ways, including other implementations of Doherty power amplifiers.

As shown in FIG. 4, the RF input signal received from the input terminal RFIN is provided to an input of the carrier amplification stage 101 and to the input phase shifter 105. Additionally, the input phase shifter 105 phase shifts the RF input signal (by about ninety degrees at the fundamental frequency, in this example) to generate a phase shifted RF input signal for the peaking amplification stage 102. However, other implementations are possible. For instance, in another embodiment, a 3 dB or hybrid coupler is used to split the RF input signal into a pair of signals having a phase difference of about ninety degrees.

With continuing reference to FIG. 4, the carrier amplification stage 101 outputs a carrier signal, while the peaking amplification stage 102 outputs a peaking signal. Additionally, the carrier signal is phased-shifted by the output phase shifter 106 (by about ninety degrees at the fundamental frequency, in this example), and thereafter combined with the peaking signal to generate an RF output signal for the output terminal RFOUT. However, other implementations are possible. For instance, a 3 dB or hybrid coupler can be used to combine the carrier signal and the peaking signal.

In the illustrated embodiment, the carrier amplification stage 101 includes a gain transistor 107, and the saturation detector 103 includes a detection transistor 108 that is thermally coupled to the gain transistor 107. Additionally, the input of the saturation detector 103 is electrically connected to the input of the carrier amplification stage 101. Furthermore, the saturation detector 103 outputs a saturation detection signal $SAT_{DETECT}$, which is provided to the peaking amplification stage 102.

The saturation detection signal $SAT_{DETECT}$ is processed by the peaking amplification stage 102 to compensate the power amplifier system 110 for saturation of the carrier amplification stage 101.

In certain implementations, the saturation detection signal $SAT_{DETECT}$ adjusts a bias level of the peaking amplification stage 102 to compensate for saturation of the carrier amplification stage 101. For example, the saturation detection signal $SAT_{DETECT}$ can serve to turn on the peaking amplification stage 102 at the appropriate time regardless of supply voltage and/or load line condition.

Accordingly, the power amplifier system 110 can be implemented such that the peaking amplification stage 102 turns on in response to saturation of the carrier amplification stage 101. Thus, the turn-on characteristic of the peaking amplification stage 102 can be a function of the compression of the carrier amplification stage 101 rather than input power alone. Accordingly, linearity of the Doherty power amplifier is improved over variation in load VSWR, process, and/or temperature.

In contrast, a Doherty power amplifier without such compensation has poor performance in the presence of changes of VSWR. For instance, AM/AM of a carrier amplification stage of such a Doherty power amplifier is a function of the load VSWR, while the AM/AM of the peaking amplification stage of the Doherty power amplifier is a function of input power, which is typically uncorrelated to the load VSWR. Thus, severe non-linearity can occur even with low VSWR when the compression characteristic of the carrier amplification stage is in sync with the turn-on characteristic of the peaking amplification stage.

Figure 5:
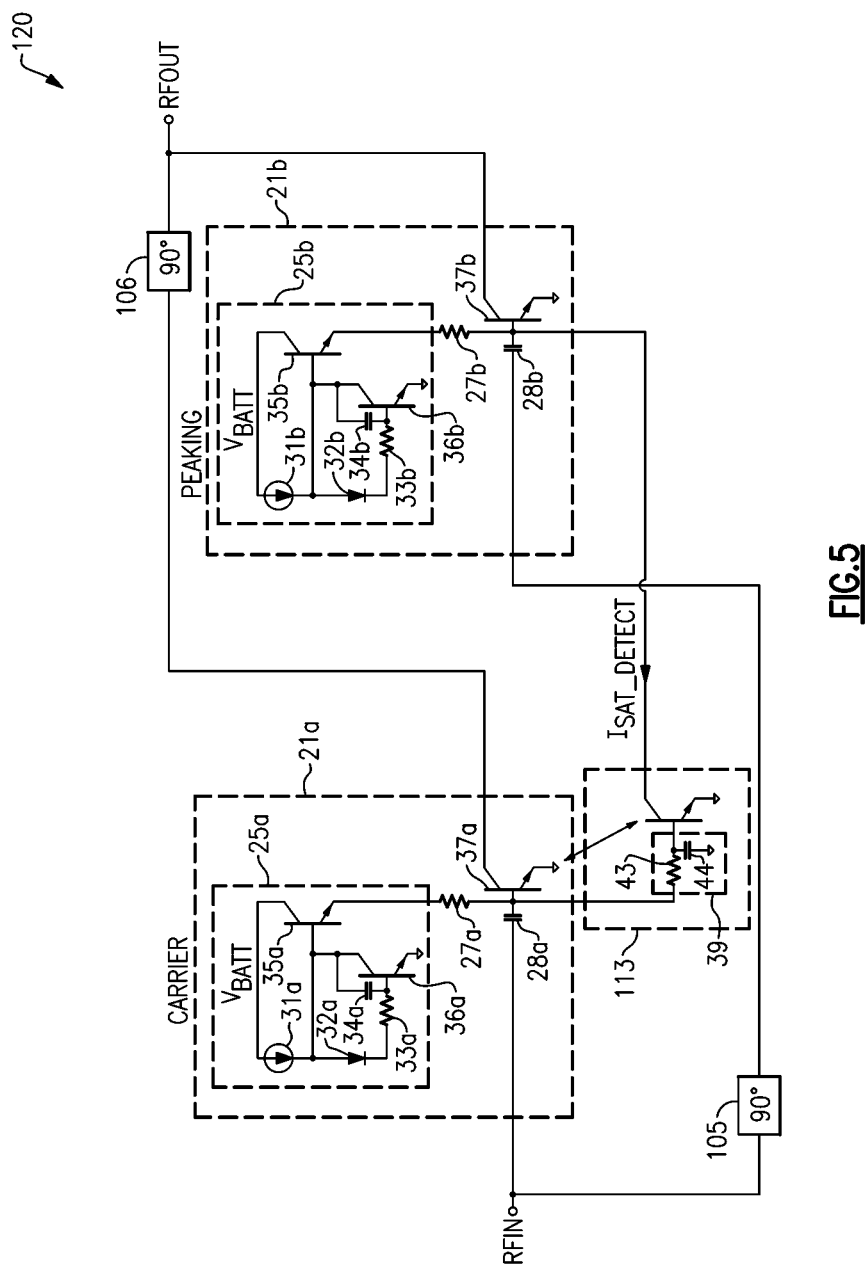
FIG. 5 is a schematic diagram of another embodiment of a power amplifier system with saturation detection.

FIG. 5 is a schematic diagram of another embodiment of a power amplifier system 120 with saturation detection. The power amplifier system 120 includes a Doherty power amplifier including a carrier amplification stage 21a, a peaking amplification stage 21b, an input phase shifter 105, and an output phase shifter 106. The power amplifier system 110 further includes a saturation detector 113.

The carrier amplification stage 21a and the peaking amplification stage 21b are each implemented using a configuration similar to that of the power amplifier 21 of FIG. 2A.

For example, the carrier amplification stage 21a includes a bias circuit 25a, a first bias resistor 27a, a DC blocking capacitor 28a, and a bipolar gain transistor 37a. Additionally, the bias circuit 25a is powered by a battery voltage $V_{BATT}$, and includes a reference current source 31a, a diode 32a, a second bias resistor 33a, a bias capacitor 34a, a first bipolar bias transistor 35a, and a second bipolar bias transistor 36a. The peaking amplification stage 21b includes a bias circuit 25b, a first bias resistor 27b, a DC blocking capacitor 28b, and a bipolar gain transistor 37b. Additionally, the bias circuit 25b is powered by the battery voltage $V_{BATT}$, and includes a reference current source 31b, a diode 32b, a second bias resistor 33b, a bias capacitor 34b, a first bipolar bias transistor 35b, and a second bipolar bias transistor 36b.

The saturation detector 113 of FIG. 5 is similar to the saturation detector 23 of FIG. 2A, except that that the saturation detector 113 omits the detection resistor 41 of FIG. 2A in favor of generating a saturation detection current $I_{SAT\_DETECT}$.

In the illustrated embodiment, the saturation detection current $I_{SAT\_DETECT}$ is provided to the base of the bipolar gain transistor 37b of the peaking amplification stage 21b. When the carrier amplification stage 21a is not in saturation, the saturation detection current $I_{SAT\_DETECT}$ is high to pull down the base of the bipolar gain transistor 37b and turn off the peaking amplification stage 21b. However, when the carrier amplification stage 21a is in saturation, the saturation detection current $I_{SAT\_DETECT}$ is low and the bias circuit 25b pulls the base of the bipolar gain transistor 37b up to bias the peaking amplification stage 21b for amplification (for instance, in class AB operation).

Figure 6A:
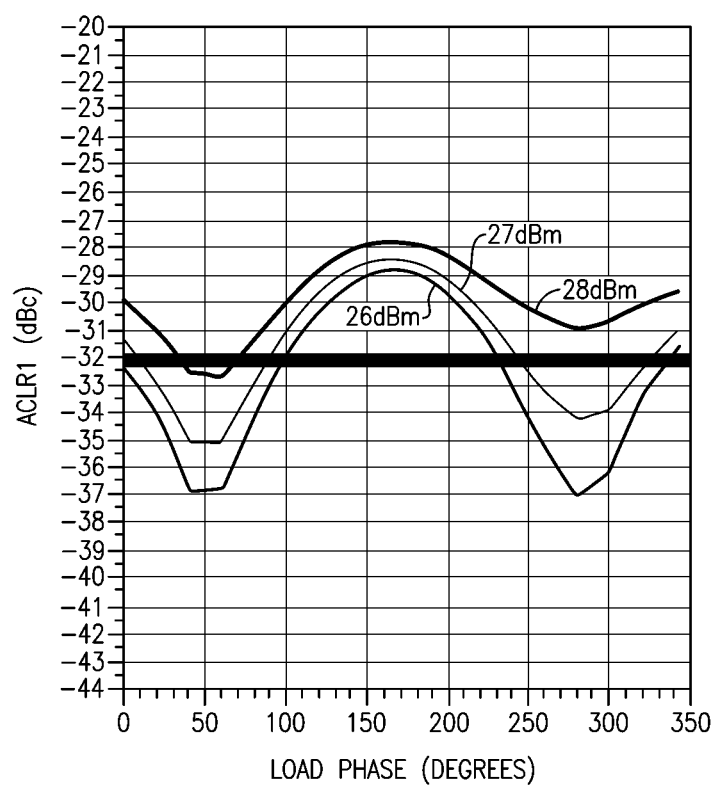
FIG. 6A is a graph of one example of plots of adjacent channel leakage ratio (ACLR) versus load phase.

FIG. 6A is a graph of one example of plots of ACLR versus load phase. The graph includes plots of ACLR1 for a cyclic prefix orthogonal frequency division multiplexing (CP-OFDM) waveform for 26 dBm, 27 dBm, and 28 dBm. The graph corresponds to a simulation of a Doherty power amplifier implemented without saturation detection.

In the example of FIG. 6A, the Doherty power amplifier exhibits relatively little shift in ACLR1 with PBO. Additionally, the Doherty power amplifier failed by 4 dB (for an ACLR1 limit of −32 dBc as indicated by the bold horizontal line in FIG. 6A) across 2:1 VSWR.

Figure 6B:
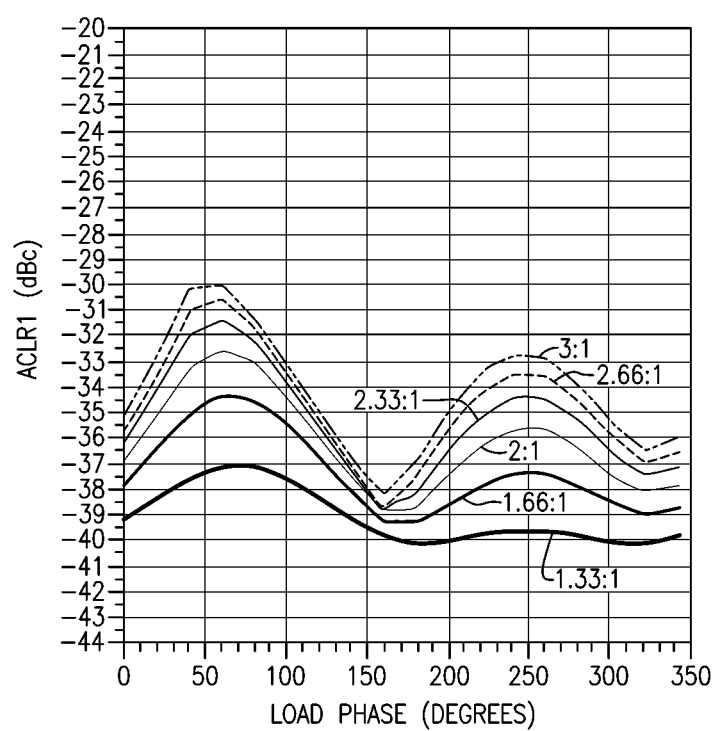
FIG. 6B is a graph of another example of plots of ACLR versus load phase.

FIG. 6B is a graph of another example of plots of ACLR versus load phase. The graph includes plots of ACLR1 for a CP-OFDM waveform. Plots are provided for VSWR ratios of 1.33:1, 1.66:1, 2:1, 2.33:1, 2.66:1, and 3:1 for a simulation of one implementation of the power amplifier system 120 of FIG. 5. As shown in FIG. 6B, −30 dBc is passed at about 3:1 VSWR, while −33 dBc is passed at about 2:1 VSWR.

Figure 7A:
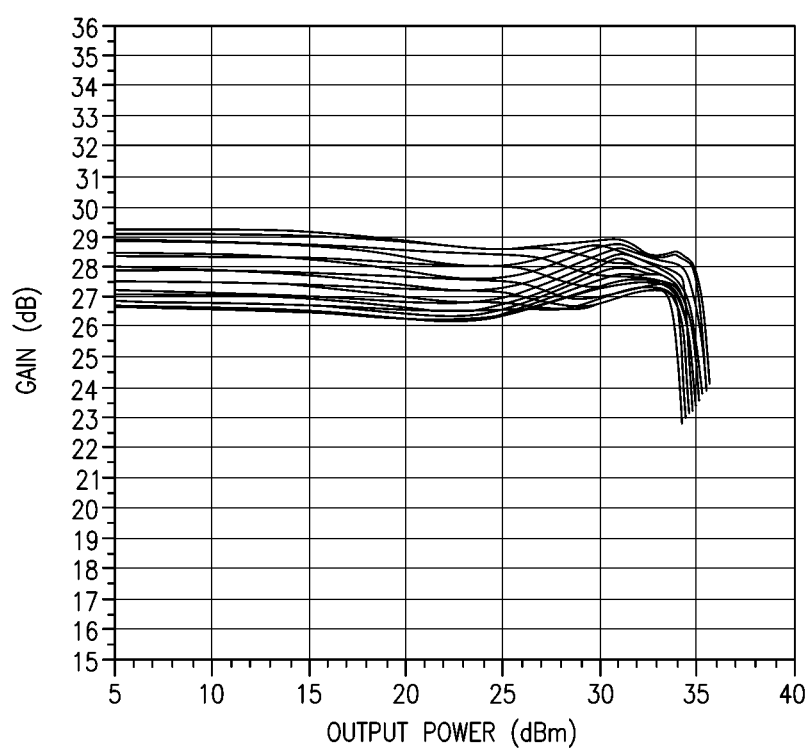
FIG. 7A is a graph of one example of plots of gain versus output power.

FIG. 7A is a graph of one example of plots of gain versus output power. The plots correspond to different amounts of load mismatch for a simulation of a Doherty power amplifier implemented without saturation detection.

The graph depicts cross-over points associated with amplitude distortion (AM/AM). As shown in FIG. 7A, the cross-over points change with amount of load mismatch. Additionally, AM/AM of the Doherty power amplifier's carrier amplification stage is a function of load, while AM/AM of the Doherty power amplifier's peaking amplification stage is a function of input power.

Figure 7B:
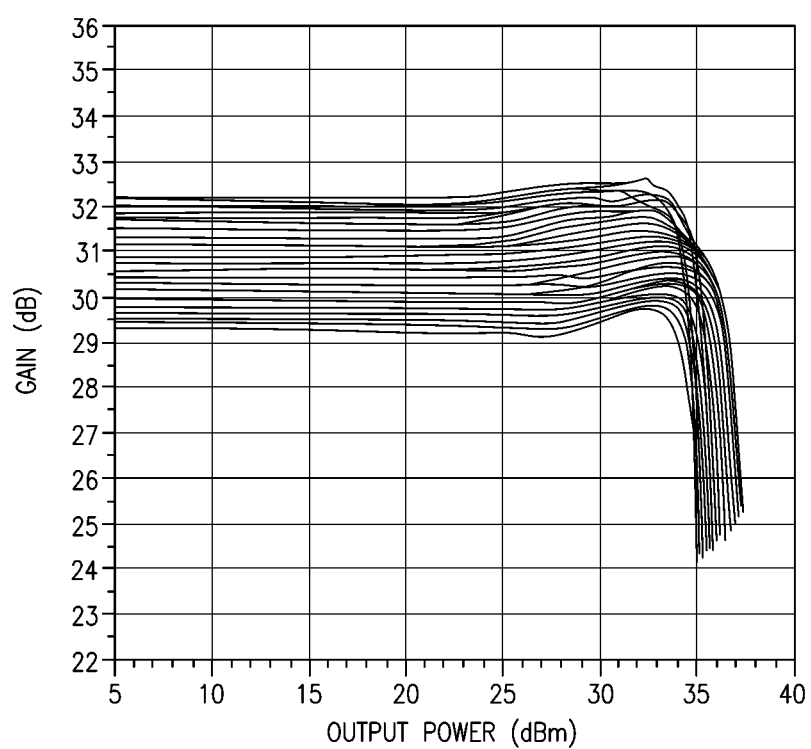
FIG. 7B is a graph of another example of plots of gain versus output power.

FIG. 7B is a graph of another example of plots of gain versus output power. The plots correspond to different amounts of load mismatch for a simulation of one implementation of the power amplifier system 120 of FIG. 5. As shown in FIG. 7B, the cross-over points are relatively constant in the presence of changes to load mismatch.

Figure 8:
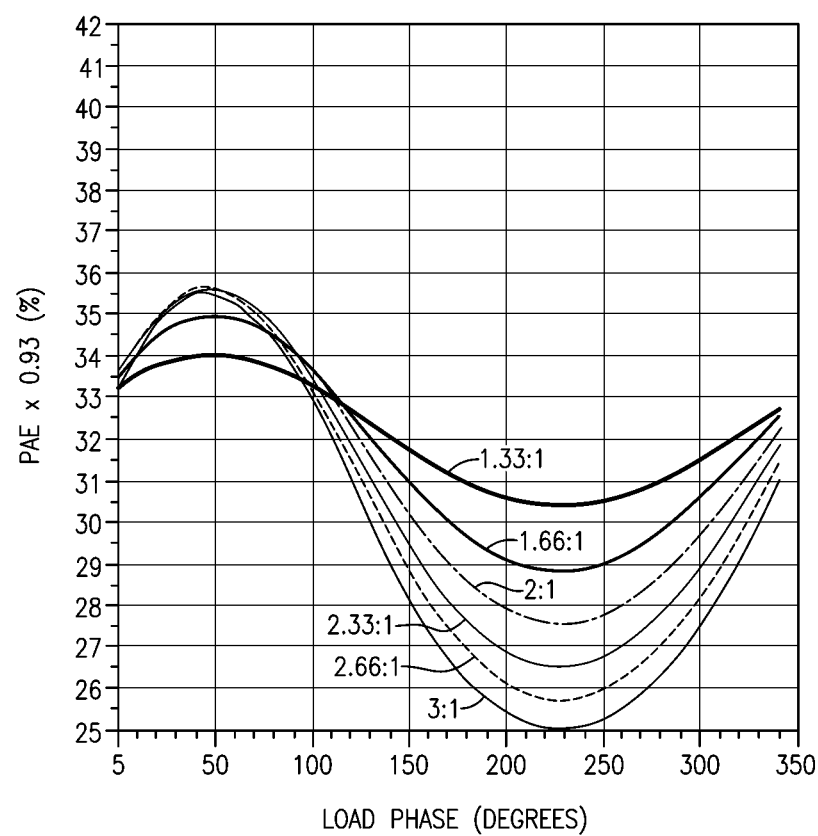
FIG. 8 is a graph of one example of plots of power added efficiency (PAE) versus load phase.

FIG. 8 is a graph of one example of plots of power added efficiency (PAE) versus load phase. Plots are provided for VSWR ratios of 1.33:1, 1.66:1, 2:1, 2.33:1, 2.66:1, and 3:1 for a simulation of one implementation of the power amplifier system 120 of FIG. 5.

Figure 9:
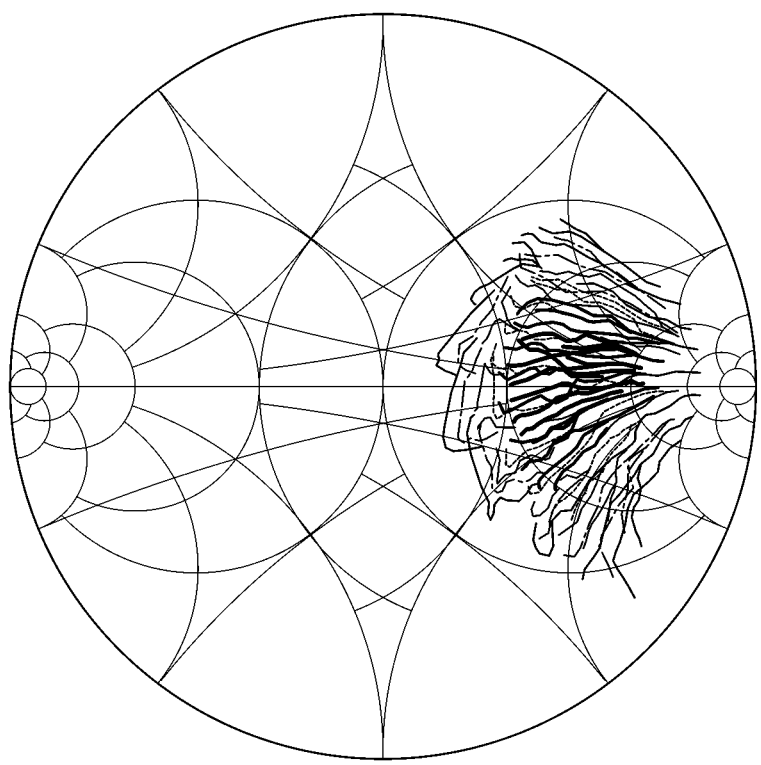
FIG. 9 is one example of a Smith chart of load line impedance for various voltage standing wave ratios (VSWRs).

FIG. 9 is one example of a Smith chart of load line impedance for various VSWRs. The Smith chart is a 7 Ohm chart depicting impedance trajectories for a final stage load line for one implementation of the power amplifier system 120 of FIG. 5. Trajectories are depicted for a range of VSWR conditions between 1.33:1 and 3:1.

Although various example of simulation results are depicted in FIGS. 6A-9, simulation results can vary based on a wide variety of factors, such as design implementation and/or simulation tools, models, and/or parameters. Accordingly, other results are possible.

Figure 10:
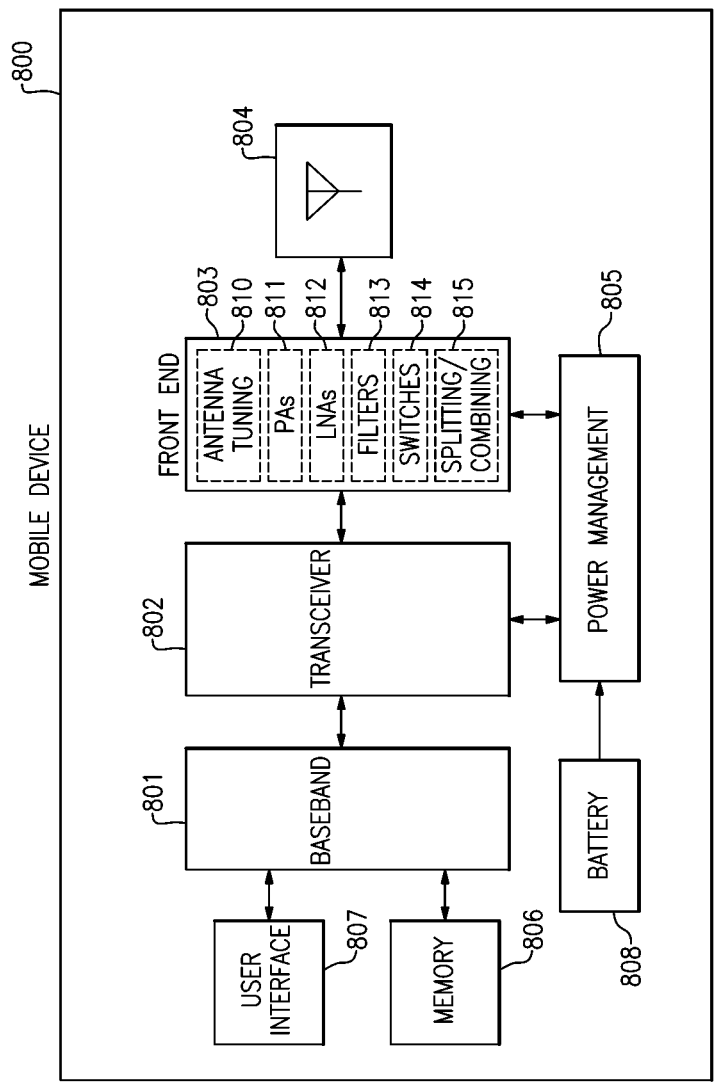
FIG. 10 is a schematic diagram of one embodiment of a mobile device.

FIG. 10 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 10 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

At least one of the power amplifiers 811 is implemented with saturation detection in accordance with the teachings herein. Although the mobile device 800 illustrates one embodiment of a communication system that can be implemented with a power amplifier system with saturation detection, the teachings herein are applicable to a wide range of systems. Accordingly, other implementations are possible.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 10, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 10, the power management system 805 receives a battery voltage from the battery 808. The battery 808 can be any suitable battery for use in the mobile device 800, including, for example, a lithium-ion battery.

Figure 11:
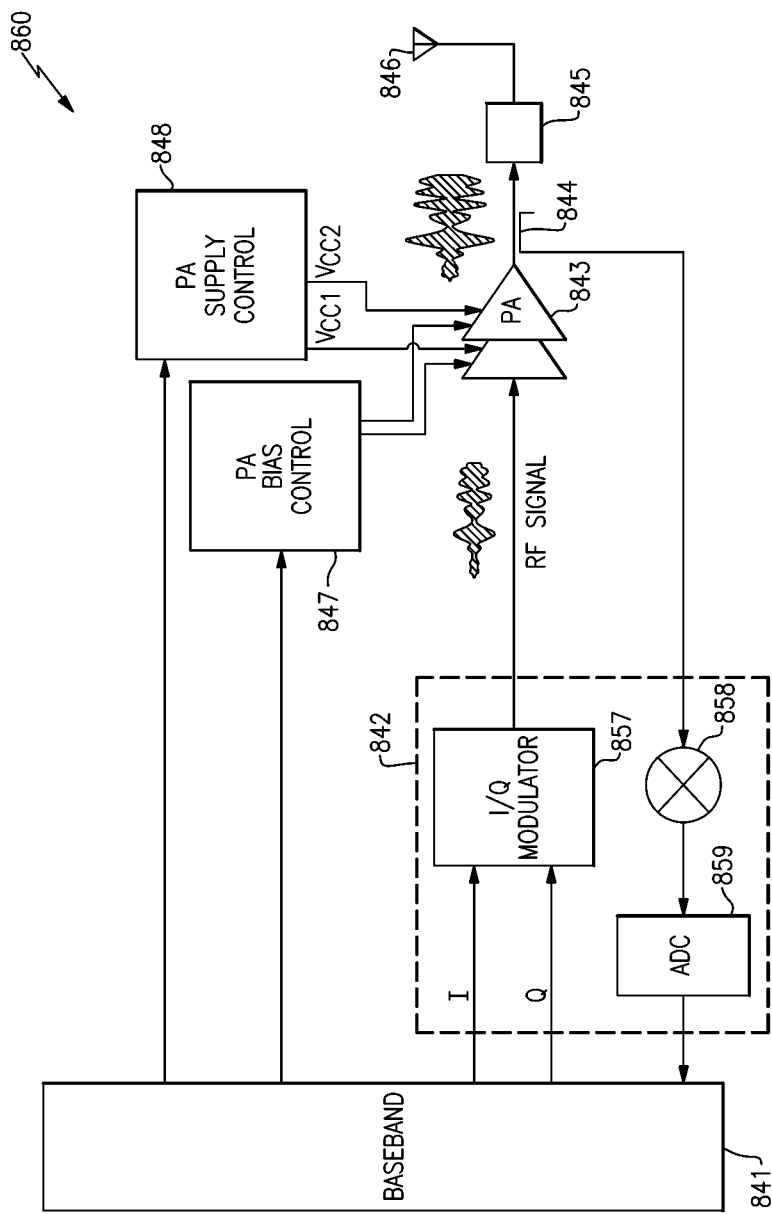
FIG. 11 is a schematic diagram of a power amplifier system according to another embodiment.

FIG. 11 is a schematic diagram of a power amplifier system 860 according to another embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 821 can be included in the power amplifier system 860.

The I/Q modulator 857 can be configured to receive the I and Q signals from the baseband processor 821 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845. The power amplifier 843 can be implemented in accordance with any of the saturation detection schemes herein.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 11, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Figure 12A:
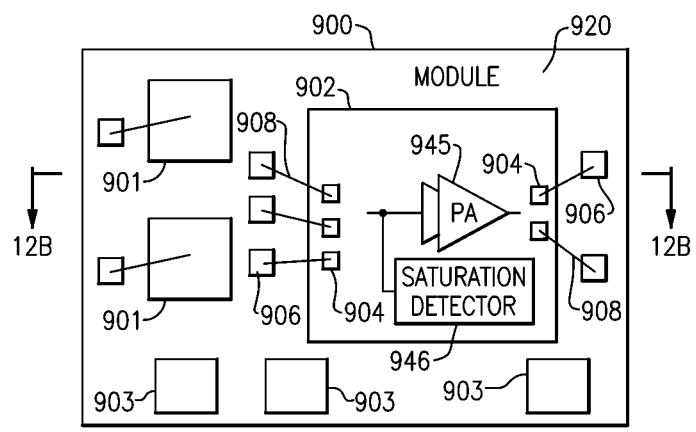
FIG. 12A is a schematic diagram of one embodiment of a packaged module.
Figure 12B:
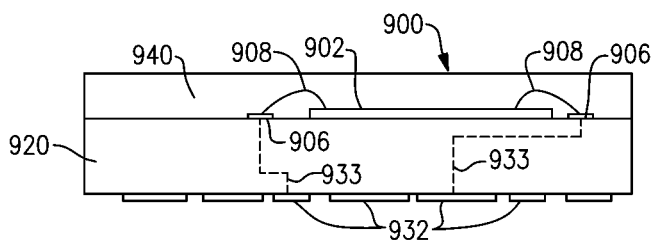
FIG. 12B is a schematic diagram of a cross-section of the packaged module of FIG. 12A taken along the lines 12B-12B.

FIG. 12A is a schematic diagram of one embodiment of a packaged module 900. FIG. 12B is a schematic diagram of a cross-section of the packaged module 900 of FIG. 12A taken along the lines 12B-12B.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a power amplifier 945 and a saturation detector 946, which can be implemented in accordance with any of the embodiments herein.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 12B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 12B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:
1. A power amplifier system comprising:
a power amplifier including an input configured to receive a radio frequency signal, a gain bipolar transistor configured to amplify the radio frequency signal, and a capacitor connected between the input of the power amplifier and a base of the gain bipolar transistor; and a saturation detector including a detection bipolar transistor that is thermally coupled to the gain bipolar transistor, the saturation detector further including an input electrically connected to the base of the gain bipolar transistor and an output configured to generate a saturation detection signal indicating a saturation of the gain bipolar transistor, the saturation detector further including a modulation bandwidth filter electrically connected between the base of the gain bipolar transistor and a base of the detection bipolar transistor.

2. The power amplifier system of claim 1 wherein the power amplifier is a Doherty power amplifier including a carrier amplification stage and a peaking amplification stage.

3. The power amplifier system of claim 2 wherein the carrier amplification stage includes the gain bipolar transistor, and the saturation detector is configured to provide the saturation detection signal to the peaking amplification stage.

4. The power amplifier system of claim 3 wherein the saturation detection signal is operable to turn on the peaking amplification stage in response to the saturation detection signal indicating that the gain bipolar transistor is saturated.

5. The power amplifier system of claim 3 wherein the saturation detection signal is operable to adjust a bias of the peaking amplification stage.

6. The power amplifier system of claim 1 wherein the saturation detection signal is operable to adjust a voltage level of a power amplifier supply voltage of the power amplifier.

7. The power amplifier system of claim 6 further comprising a power management circuit configured to increase the voltage level of the power amplifier supply voltage in response to the saturation detection signal indicating that the gain bipolar transistor has saturated.

8. The power amplifier system of claim 1 wherein the detection bipolar transistor and the gain bipolar transistor are located within about 20 µm.

9. The power amplifier system of claim 1 wherein the gain bipolar transistor and the detection bipolar transistor are NPN bipolar transistors.

10. A mobile device comprising:
a transceiver configured to generate a radio frequency signal; and
a front end system including a power amplifier configured to receive the radio frequency signal at an input and including a gain bipolar transistor configured to amplify the radio frequency signal and a capacitor connected between the input of the power amplifier and a base of the gain bipolar transistor, the front end system further including a saturation detector including a detection bipolar transistor that is thermally coupled to the gain bipolar transistor, the saturation detector further including an input electrically connected to the base of the gain bipolar transistor and an output configured to generate a saturation detection signal indicating a saturation of the gain bipolar transistor, the saturation detector further including a modulation bandwidth filter electrically connected between the base of the gain bipolar transistor and a base of the detection bipolar transistor.

11. The mobile device of claim 10 wherein the power amplifier is a Doherty power amplifier including a carrier amplification stage and a peaking amplification stage.

12. The mobile device of claim 11 wherein the carrier amplification stage includes the gain bipolar transistor, and the saturation detector is configured to provide the saturation detection signal to the peaking amplification stage.

13. The mobile device of claim 12 wherein the saturation detection signal is operable to turn on the peaking amplification stage in response to the saturation detection signal indicating that the gain bipolar transistor is saturated.

14. The mobile device of claim 12 wherein the saturation detection signal is operable to adjust a bias of the peaking amplification stage.

15. The mobile device of claim 10 wherein the saturation detection signal is operable to adjust a voltage level of a power amplifier supply voltage of the power amplifier, the mobile device further including a power management system configured to increase the voltage level of the power amplifier supply voltage in response to the saturation detection signal indicating that the gain bipolar transistor has saturated.

16. A method of power amplifier saturation detection, the method comprising:
receiving a radio frequency signal at an input to a power amplifier that includes a gain bipolar transistor and a capacitor connected between the input of the power amplifier and a base of the gain bipolar transistor;
amplifying the radio frequency signal using the gain bipolar transistor;
generating a saturation detection signal indicating a saturation of the gain bipolar transistor using a saturation detector, including thermally coupling the gain bipolar transistor to a detection bipolar transistor of the saturation detector, and providing an input voltage at the base of the gain bipolar transistor to an input of the saturation detector; and
providing filtering using a modulation bandwidth filter of the saturation detector, the modulation bandwidth filter electrically connected between the base of the gain bipolar transistor and a base of the detection bipolar transistor.

17. The method of claim 16 wherein the power amplifier is a Doherty power amplifier including a carrier amplification stage that includes the gain bipolar transistor, and a peaking amplification stage, the method further comprising turning on the peaking amplification stage in response to the saturation detection signal indicating that the gain bipolar transistor is saturated.

18. The power amplifier system of claim 1 wherein the modulation bandwidth filter includes a filter resistor electrically connected between the base of the gain bipolar transistor and the base of the detection bipolar transistor, and a filter capacitor electrically connected between the base of the detection bipolar transistor and a ground voltage.

19. The mobile device of claim 10 wherein the modulation bandwidth filter includes a filter resistor electrically connected between the base of the gain bipolar transistor and the base of the detection bipolar transistor, and a filter capacitor electrically connected between the base of the detection bipolar transistor and a ground voltage.

20. The method of claim 16 wherein the modulation bandwidth filter includes a filter resistor electrically connected between the base of the gain bipolar transistor and the base of the detection bipolar transistor, and a filter capacitor electrically connected between the base of the detection bipolar transistor and a ground voltage.

* * * * *